United States Patent
Kliman

(10) Patent No.: US 6,199,023 B1
(45) Date of Patent: Mar. 6, 2001

(54) SYSTEM FOR REMOVING SPURIOUS SIGNATURES IN MOTOR CURRENT SIGNATURE ANALYSIS

(75) Inventor: Gerald Burt Kliman, Niskayuna, NY (US)

(73) Assignee: Geneal Electric Company, Schenectady, NY (US)

( * ) Notice: Subject to any disclaimer, the term of this patent is extended or adjusted under 35 U.S.C. 154(b) by 0 days.

(21) Appl. No.: 09/192,241

(22) Filed: Nov. 16, 1998

(51) Int. Cl.[7] .................................................. G01R 23/00

(52) U.S. Cl. .............................. 702/67; 702/76; 324/545; 324/772; 318/805; 318/490

(58) Field of Search .................................. 702/64, 69, 75, 702/76, 77; 324/545, 772, 76.19, 76.24; 318/805, 806, 490, 491

(56) References Cited

U.S. PATENT DOCUMENTS

| | | | |
|---|---|---|---|
| 4,678,990 | * 7/1987 | Bicknell et al. ..................... | 702/76 |
| 4,965,513 | * 10/1990 | Haynes et al. ....................... | 324/772 |
| 4,978,909 | * 12/1990 | Hendrix et al. ...................... | 324/772 |
| 5,365,158 | * 11/1994 | Tanaka et al. ....................... | 318/806 |
| 5,420,523 | * 5/1995 | Walker et al. ....................... | 324/772 |
| 5,461,329 | * 10/1995 | Linehan et al. ...................... | 702/77 |
| 5,550,880 | 8/1996 | Abdel-Malek et al. . | |
| 5,576,632 | 11/1996 | Petsche et al. . | |
| 5,629,870 | 5/1997 | Farag et al. . | |
| 5,689,194 | * 11/1997 | Richards, II et al. ............... | 324/772 |

OTHER PUBLICATIONS

Jeffery L. Kohler and Joseph Sottile, Incipient Failure Prediction For Electrical Machines, pp. 96–109.

Jonathan A. Siegler, Motor Current Analysis For The Diagnosis Of Fault Conditins In A Motor Driven Pump, pp. 230–241.

Ronald C. Tate, Current Analysis For the Condition Assessment of Shipboard Motor Driven Machinery, pp. 277–300, Proceedings of the 49th Meeting of the Society for Machinery Failure Prevention Technology, Apr. 18–20, 1995, Va.

Kliman, Noninvasive Detection of Broken Rotor Bars In Operating Induction Motors, pp. 873–879, IEEE, vol. 3, No. 4, Dec. 1988.

Chow, Motor Fault Detection and Diagnosis, Department of Electrical and Computer Enbgineering, North Carolina State University, Raleigh, NC.

G. B. Kliman, et al, Methods of Motor Current Signature Analysis, Electric Machines and Power Systems, 20:463–474, 1992.

GA Capolino, et al, Induction Machine Parameters Identification Comparison of Different Algorithms, Int. Conf. on Elect. Machines, Mass. Ins. of Technology, pp. 940–945, Aug. 13–15, 1990.

* cited by examiner

*Primary Examiner*—Marc S. Hoff
*Assistant Examiner*—Bryan Bui
(74) *Attorney, Agent, or Firm*—Ann M. Agosti; Jill M. Breedlove

(57) ABSTRACT

A method for removing spurious signals in a process of motor current signature analysis of an electric motor (24 or 33) includes creating an electronic model of the motor, acquiring simultaneous measurements of voltage and current at the motor, applying the voltage measurement to the motor model and determining an equivalent current produced in the motor model by the applied voltage, subtracting the equivalent current from the current measurement to produce a corrected motor current, and processing the corrected motor current through motor current signature analysis. For an ac motor (33), the method includes extracting signals corresponding to the fundamental excitation frequency from the voltage measurement to produce an interfering voltage, processing the interfering voltage through the motor model to produce a corresponding spurious current signal, and subtracting the spurious current signal from the measured current to produce the corrected motor current signal for analysis.

16 Claims, 4 Drawing Sheets

SYSTEM FOR REMOVING SPURIOUS SIGNATURES IN MOTOR CURRENT SIGNATURE ANALYSIS

BACKGROUND OF THE INVENTION

The present invention relates generally to fault detection in operating electric motors and, more particularly, to a method for removing spurious current signatures in the process of motor current signature analysis of such motors.

Motor current signature analysis (MCSA) is a technique for monitoring and diagnosing mechanical problems associated with rotating machines driven by electric motors as well as fault conditions which may exist in the motors themselves. MCSA is based upon the fact that variations in motor geometry, load torque or speed will cause corresponding changes in motor current. The interpretation of the changes in motor current can be used to draw conclusions as to the health of the motor or load. Numerous papers and patents have been published which discuss the MCSA process. For example, Kliman et al., "Noninvasive Detection of Broken Rotor Bars in Operating Induction Motors," *IEEE Transactions on Energy Conversion,* Vol. 3, No. 4, December 1988, pages 873–879, discusses a non-invasive detection of broken rotor bars in operating induction motors. Another paper relating to the same subject is Kliman et al., "Methods of Motor Current Signature Analysis," *Electric Machines and Power Systems,* No. 20, 1992, pages 463–474. The latter paper lists a number of other references on the same subject. All of these papers discuss how MCSA can be utilized to identify fault conditions in either the motor or in loads connected to the motor.

In general, some systems utilizing multiple motors do not have a stiff voltage source that is capable of maintaining a constant voltage irrespective of variations in any one of the motors. As a result, motor current signature analysis may identify a problem with a particular motor when in fact the problem arises from another motor in the same system. Consequently, a motor can be detected as having a broken bar or other defect, be taken off line, and then, on physical examination, be found to not have a defect. Signals representative of such false defect detections unpredictably appear and disappear and are sometimes referred to as "ghosts."

SUMMARY OF THE INVENTION

One of the problems, recognized in the present invention, with motor current signature analysis is that spurious signatures are created in a motor from electromagnetic interference or from other loads which may be connected to the same voltage source as the motor of interest. These false indications of defects are often caused by the spurious signals generated in a typical weak voltage system such as may be found on ships, locomotives or other vehicles utilizing on-board generated power. Accordingly, it would be advantageous to provide a method which enables identification and removal of motor current anomalies which are caused by spurious or ghost signals on the power system and not by fault conditions associated with the motor.

In conventional motor current signature analysis, time functions or spectra of motor current are examined to determine the health or status of the motor or of the driven load since the driven load creates torque or speed variations on the motor shaft which are reflected as current variations in motor current. The motor current signals may be quite small, particularly in comparison with the amplitude of the fundamental frequency of current flowing in the motor. For example, the signals to be analyzed for signature analysis may be as much as 100 DB below the power component of motor current. In MCSA (motor current signature analysis), the transducer which is used for condition monitoring is the motor itself which is simultaneously serving as an energy converter for the load. While this poses data acquisition and processing problems, the situation is further complicated by the presence of other large power converters on the same or related buses driving their own loads and responding to the particular needs and peculiarities of their loads. If the bus were ideal and maintained a perfect sine wave at line frequency with constant amplitude and phase, spurious currents would not be an issue. However, even in a large base load power plant, the auxiliary power distribution system has considerable impedances due to transformers, switches, connections and the cabling itself. These problems will be especially severe in mobile power plants and distribution systems such as on naval vessels, air craft and locomotives where the generators are relatively small and closely matched to the anticipated load magnitude. Additionally, in such installations, the prime movers themselves may introduce variation in the voltage applied to the motors.

Previous attempts to resolve the problem of spurious or interfering voltages have approached the problem on a theory that the motor impedance or admittance ought to be independent of line conditions. This theory is based on the erroneous concept that the motor is a passive rather than an active device. Further, the motor is a highly non-linear active device. Even the traditional per phase steady state equivalent circuit will fail to account for bus interference promptly since the equivalent circuit is based on the assumption that voltage and current are proportional.

The present invention recognizes the active nature of a motor, that voltages are generated in the motor windings due to relative motion of the motor shaft or by variation of motor flux and that these variations may not be directly related to the applied voltage. In general, the invention is illustrated as a method for removing spurious signals in a process of motor current signature analysis of an electric motor by using an electronic model of the motor to identify motor current signature components that are spurious signals created by variations in the applied voltage. The method includes acquiring simultaneous measurements of voltage and current at the motor, applying the measured voltage to the motor model and determining an equivalent current produced in the motor model by the applied voltage, subtracting the equivalent current from the measured current to produce a corrected motor current and then processing the corrected motor current through conventional motor current signature analysis.

BRIEF DESCRIPTION OF THE DRAWINGS

For a better understanding of the present invention, reference may be had to the following detailed description taken in conjunction with the accompanying drawings in which.

DETAILED DESCRIPTION OF THE INVENTION

Figure 1:
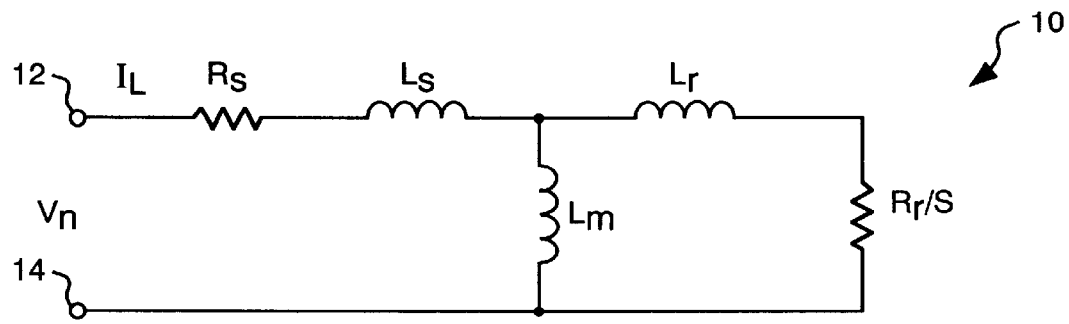
FIG. 1 is a conventional per phase steady state equivalent circuit of an ac motor.

Turning first to FIG. 1, there is shown a traditional per phase steady state equivalent circuit of an ac electric induction motor. The traditional equivalent circuit 10 has a pair of input terminals 12, 14. A resistor $R_s$ representative of stator winding resistance connects to the terminal 12 and to an inductor $L_s$ representative of stator leakage inductance. Another inductor $L_M$ representing mutual inductance between the stator and rotor connects between the inductor $L_s$ and the second input terminal 14. Another inductor $L_R$ representative of rotor leakage inductance and a resistor $R_R/S$ representative of rotor resistance, both of which are referred to the stator, are connected in a series circuit in parallel with the mutual inductance $L_M$. The S term represents per unit slip. The applied voltage is $V_N$, and the resultant line current is $I_L$. The traditional equivalent circuit shown in FIG. 1 ignores any active nature of the motor and assumes that all reactions within the motor create proportional voltage and current changes.

Because an electric motor is an active device, voltages are generated in the windings, due to motion of the motor or field variation of the rotor, that are often not directly related to the line voltage. In particular, the equivalent circuit of FIG. 1 does not compensate for voltage changes caused by rotary or translational motion variations of the rotor or windings. Accordingly, a more exact representation of the equivalent circuit of a motor requires consideration of this active response.

Figure 2:
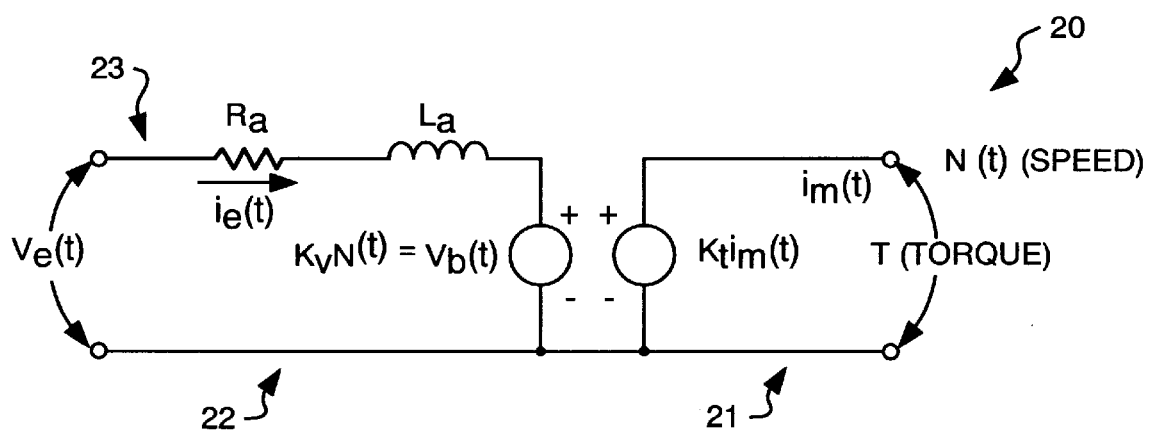
FIG. 2 is a conventional equivalent circuit of a dc motor.
Figure 3:
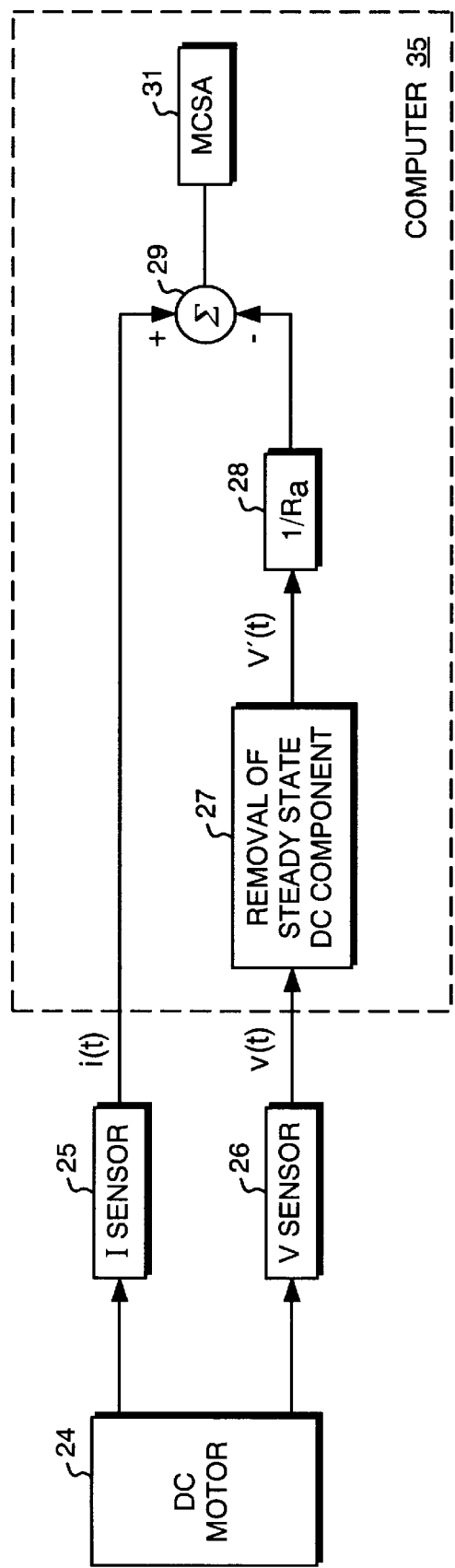
FIG. 3 is a block diagram of a method for removing spurious motor current signatures from a dc motor according to one embodiment of the present invention.

FIGS. 2 and 3 below relate to removal of spurious signatures in dc motor current signature analysis, and FIGS. 4–7 below relate to removal of spurious signatures in ac motor current signature analysis.

FIG. 2 illustrates a equivalent circuit of a permanent magnet (PM) excited direct current (dc) motor of the present invention. Although the equivalent circuit is shown for a PM motor for purposes of example, other types of dc motors can be modeled. Similar concepts apply to ac motors, but the implementation and details differ as will be discussed below with respect to FIGS. 4–7. For the purpose of this discussion, the motor's relatively small armature inductance is neglected, and equivalent circuit 20 includes a torque source $K_t i_m(t)$ proportional to current $i_m(t)$ driving inertias and power absorbing load on a mechanical side 21 of the motor. For this motor, the resistor $R_a$ represents armature and brush resistance, the inductance $L_a$ represents armature inductance and the voltage and torque constants are represented by $K_v$ and $K_T$, where $K_v$ is the voltage constant and $K_T$ is the torque constant. The mechanical side of the motor is represented by a speed input N(t) and a resultant torque applied across the voltage generator $K_t i_m(t)$. On an electrical side 22 of the motor model, a voltage generator is represented by the term $K_v N(t)$. The voltage source KvN(t) is essentially a back EMF generator which is proportional to shaft speed and the equivalent resistance of the armature, windings, commutator and brushes.

In one embodiment of the present invention, the equivalent circuit of FIG. 2 is analyzed as follows. If it is assumed that the shaft speed in FIG. 2 has been modulated by a load which creates the motor current signature that is to be detected, the shaft speed will be given by the equation:

$$N(t)=N_0 X[1+f(t)],$$

where $N_0$ is the steady speed component and f(t) is a small variation in speed caused by variation in loading.

Similarly, if it is assumed that the supply bus 23 is relatively soft, resulting in some arbitrary variation in line voltage Ve(t) as a result of the variation and torque loading on another motor, then the line voltage Ve(t) applied to the motor equivalent circuit consists of a steady or dc component $V_0$ with some variation g(t) as expressed by the following equation:

$$V_e(t)=V_0 X[1+g(t)].$$

The resultant current $i_e(t)$ in the motor equivalent circuit is determined by a combination of the above two equations which illustrates that the current is comprised of a dc component which would occur with no variations in speed or voltage and two variable components, one of which may be the desired motor current signature and the other which is a spurious signal due to the soft bus. The resulting equation can be expressed as:

$$i_e(t) = \frac{(v_e(t) - v_b(t))}{R_a}$$
$$= \frac{(v_e(t) - K_v N_o)}{R_a} + \frac{V_o}{R_a} \cdot g(t) - \frac{K_v N_o}{R_a} \cdot f(t)$$

The portion of the signal represented by $(V_e(t)-K_vN_0)/R_a$ represents the normal dc component of current, the expression $(V_o/R_a)xg(t)$ represents the spurious signal generated by variation in the applied voltage, and the expression $(K_vN_0/Ra)xf(t)$ represents the motor current signature which is desired to be analyzed.

In an embodiment of the present invention, the solution to the problem of motor current signature analysis can be resolved by removing the spurious current signal component (to obtain a "corrected" motor current) before processing the measured current signal by applying a signal representative of the voltage variation to a model of the motor, using the result to estimate the spurious current component generated by the variation in voltage, and subtracting the spurious current component from the measured current signal so that the remaining corrected current or current variation is then due to the variation in load or variation in response of the motor.

In the dc motor model as illustrated in FIG. 2, this process can be achieved, as shown by the block diagram of FIG. 3 by measuring the dc motor 24 voltage and current with voltage and current sensors 26 and 25, removing the steady state dc component of the voltage at step 27 to determine a modified voltage measurement, dividing the remaining (modified) voltage measurement by the effective motor resistance $R_a$ at step 28, and then subtracting the result from the line current at step 29 before analyzing the resulting corrected motor current signature at MCSA block 31. In one embodiment, the above steps are accomplished with a computer 35.

To create the motor model, the motor parameters must be known or be capable of estimation. Fortunately, methods of motor parameter estimation are well known in the art. For example, several techniques are described in Capolino et al., "Induction Motor Parameter Identification: Comparison of Different Algorithms", ICEM '90, MIT, August 1990. A detailed or precise model of the motor is not needed in all cases because the signals can be small, not at line frequency, and approximate methods will usually suffice. The spurious signals need only be reduced below the motor current signatures.

Figure 4:
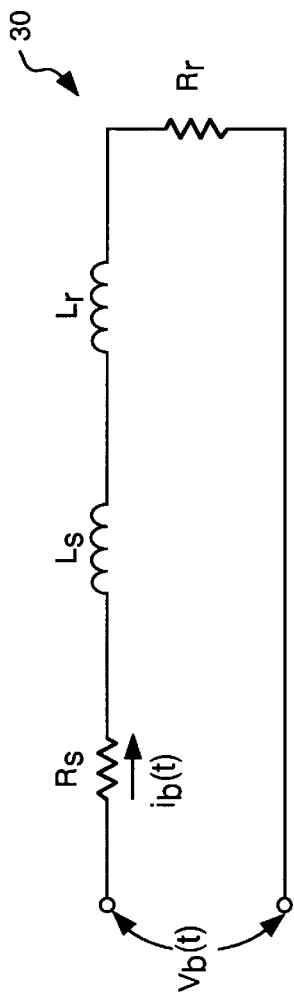
FIG. 4 is a conventional simplified model of an ac motor.

For example, in an ac motor, since the motor current components to be removed will not be at line frequency, a model 30 may simply consist of the winding resistances and leakage inductances as shown in FIG. 4 which represents an equivalent circuit of an ac induction motor 33 for purposes of example. The spurious signature removal technique of the present invention can additionally be used with other types of ac motors. As shown in FIG. 4, for estimation purposes, even the magnetizing inductance $L_M$ may be neglected in the model.

Figure 5:
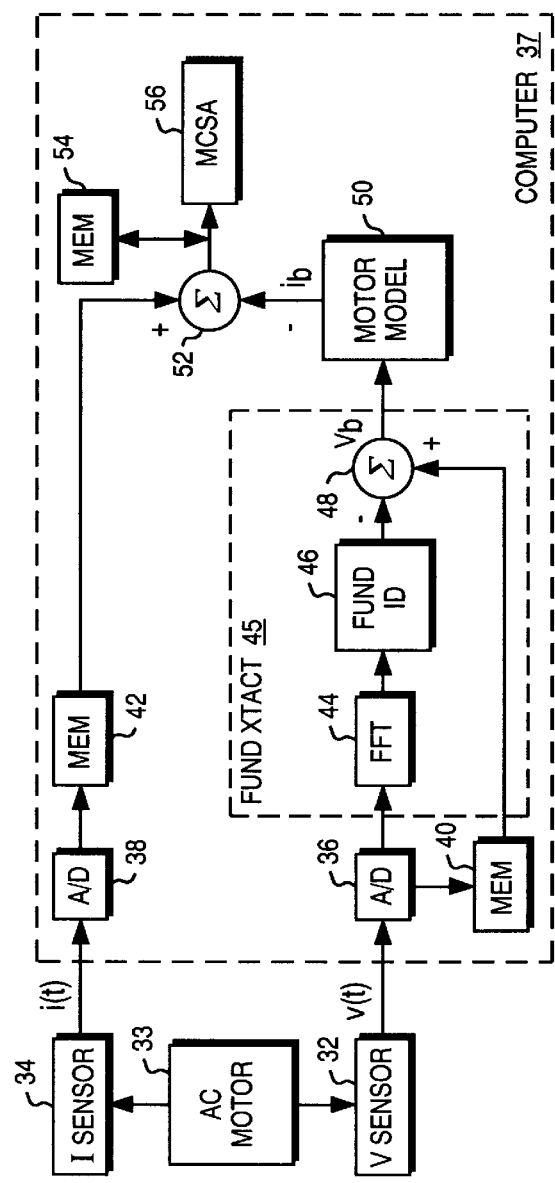
FIG. 5 is block diagram of a method for removing spurious motor current signatures from an ac motor according to another embodiment of the present invention.

Referring now to FIG. 5, there is illustrated one embodiment of a method for removing spurious motor current signatures from an ac motor 33 as may be implemented in software or hardware of a computer 37, for example. In one embodiment, simultaneous time samples of the voltage and current at the motor input terminals on the lines connected to the motor are acquired. The time samples are of sufficient length and sampling frequency to give the desired resolution. As will be appreciated, the monitored voltage and current signals are analog values obtained using conventional voltage and current sensors indicated by blocks 32 and 34. In one embodiment, for example, the measured voltage and current signals from which the time samples are acquired are line voltage and line current signals.

In FIG. 5, the monitored voltage and current signals are indicated as v(t) and i(t). Each of these signals is applied to a respective one of a pair of analog to digital (A/D) converters 36 and 38. The digitized voltage and current signals of A/D converters 36, 38 are time sampled voltage and current signals which are then applied to respective digital storage devices or memory blocks 40 and 42. A fundamental voltage component of waveform is then extracted from the digitized voltage by using, in one embodiment, an extractor 45 including a fast Fourier transform block 44 for transforming the signal into a frequency spectrum, a fundamental frequency identification block 46 for identifying the voltages at the fundamental frequencies from the spectrum, and a summing block 48 for subtracting the fundamental component from the stored digitized voltage signal obtained from memory block 40. Thus the fundamental component is removed from the measured voltage time sample. The resultant signal from summing block 48 is the interfering voltage which represents variation in the applied voltage to the motor and may be due to the soft nature of the voltage bus. This voltage variation is then applied to a motor model, block 50, which may be the motor model illustrated in FIG. 4, for example, to determine the spurious current. The output signal of block 50 is thus an estimate of the spurious current signal caused by the variations in applied voltage. The spurious current signal is then applied to a summing block 52 where it is summed with the concurrently sampled, digitized version of the measured current i(t) so as to subtract out the portion of the sampled current caused by the variations in voltage. The resulting corrected motor current signal can then be stored, block 54, or processed directly to a motor current signature analysis circuit indicated at block 56.

Figure 6:
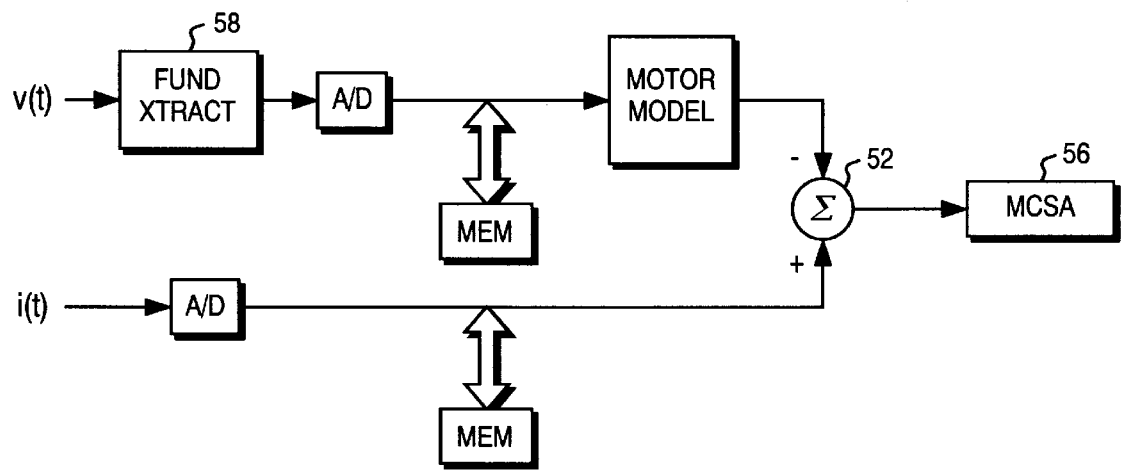
FIG. 6 is an equivalent functional block diagram of a method for removing fundamental frequency components from an ac motor current signal according to another embodiment of the present invention.
Figure 7:
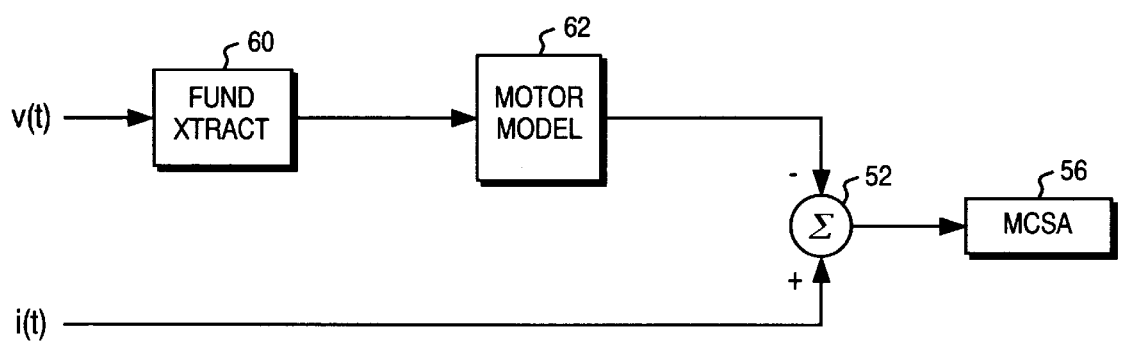
FIG. 7 is simplified functional block diagram of a process for removing spurious signals from monitored ac motor current according to another embodiment of the present invention.

The fast Fourier transform and the fundamental extraction functions can be replaced by a filter circuit which extracts the fundamental waveform (the fundamental frequency voltage). For example, U.S. Pat. No. 5,550,880 discloses a motor current signal processor using an analog subtraction of an estimated largest sine wave component. The process used in the '880 patent can be applied to replace the fast Fourier transform and extraction circuit. FIG. 6 illustrates an equivalent functional block diagram, where block 58 represents the filter system of such patent. If there is no A/D conversion (if an analog process is used), the process takes on the simplified form of FIG. 7 wherein block 60 extracts the fundamental frequency components and the resulting signal is applied to motor model 62, which may be the model of FIG. 4, for example.

The model of FIG. 4 is presented for purposes of example. Any one of a wide variety of models and equivalent circuits can be used. The appropriate model for a particular application will depend on factors such as the motor operating environment, the required degree of accuracy, and the available information regarding parameters, for example. While the circuit illustrated in FIG. 4 is suitable for providing an estimate of spurious current signals in most applications, the level of sophistication of the model, whether it is three phase or single phase, and the precision of the parameter estimation will depend on the amount and nature of the bus voltage variation and the sensitivity required. If necessary, a more complex model (not shown) can be used to account for the current transients created by torque loading on the output side of the motor.

As will be apparent, what has been described as a method for eliminating from the monitored or measured motor current signals that portion of the current signature which is generated from by external sources operating on the voltage applied to the motor. As a consequence, the false signals generated by motor current signature analysis from this external force are eliminated prior to the motor current signal being processed for motor current signature analysis. This procedure overcomes the problem in prior art systems of identifying false positives in such motor current analysis.

While the invention has been described in what is presently considered to be a preferred embodiment, various modifications will become apparent to those skilled in the art. It is intended therefore that the invention not be limited to the specific disclosed embodiment but be interpreted within the full spirit and scope of the appended claims.

What is claimed is:

1. A method for removing spurious signals in a process of motor current signature analysis of an electric motor (24 or 33), comprising:

acquiring simultaneous measurements of voltage and current at the motor;

applying the voltage measurement to a motor model (20 or 30) of the electric motor and determining an equivalent current produced in the motor model by the voltage measurement;

subtracting the equivalent current from the current measurement to produce a corrected motor current; and processing the corrected motor current through motor current signature analysis.

2. The method of claim 1 wherein the motor is a dc motor (24), and including removing a dc component from the voltage measurement prior to applying the voltage measurement to the motor model.

3. The method of claim 2 wherein determining the equivalent current comprises dividing the voltage measurement by a resistance ($R_a$) of the motor.

4. The method of claim 1 wherein the motor comprises an ac motor and the voltage measurement has a fundamental frequency, and including extracting fundamental signals corresponding to the fundamental frequency from the voltage measurement to produce an interfering voltage, wherein determining the equivalent current includes processing the interfering voltage through the motor model to produce the equivalent current.

5. The method of claim 4 wherein extracting comprises applying the voltage measurement to an analog filter (58 or 60) to remove the fundamental frequency voltage.

6. The method of claim 4 further including converting the voltage measurement to digital sampled voltage signals, and wherein extracting the fundamental signals comprises Fourier transforming the sampled voltage signals, identifying the fundamental signals from the transformed sampled voltage signals, and subtracting the identified fundamental signals from the sampled voltage signals.

7. A method for removing spurious current signals from measured current at an ac electric motor (33) to enable motor current signature analysis of the measured current, the motor being excited by an applied voltage having a fundamental frequency, the method comprising:

acquiring simultaneous measurements of voltage and current at the motor;

removing voltage corresponding to the applied fundamental frequency voltage from the voltage measurement to yield an interfering voltage;

processing the interfering voltage through a motor model corresponding to the motor to produce a spurious current signal;

subtracting the spurious current signal from the current measurement to produce a corrected current; and applying the corrected current through motor current signature analysis.

8. The method of claim 7 further including converting the voltage measurement to digital sampled voltage signals, and wherein removing comprises Fourier transforming the sampled voltage signals, identifying fundamental signals from the transformed sampled voltage signals, and subtracting the identified fundamental signals from the sampled voltage signals.

9. The method of claim 8 wherein the motor model is a computer simulation of the motor.

10. The method of claim 7 wherein removing comprises applying the voltage measurement to a filter circuit (58 or 60) to extract the fundamental frequency voltage and subtract the fundamental frequency voltage from the voltage measurement.

11. A system for removing spurious signals in a process of motor current signature analysis of an electric motor (24 or 33), comprising:

sensors (32 and 34) for acquiring simultaneous measurements of voltage and current at the motor; and a computer (35 or 37) including:

an electronic model (20 or 30) of the motor for use by the computer in determining an equivalent current produced in the motor model by the voltage measurement;

a subtractor (29 or 52) for subtracting the equivalent current from the current measurement to produce a corrected motor current; and a processor (31 or 56) for processing the corrected motor current through motor current signature analysis.

12. The system of claim 11 wherein the motor is a dc motor (24), and wherein the computer further includes a subtractor (27) for removing a dc component of the voltage from the voltage measurement to provide a modified voltage measurement, and wherein the computer uses the modified voltage measurement in the electronic motor model (28) to determine the equivalent current.

13. The system of claim 12 wherein the computer determines the equivalent current by dividing the modified voltage measurement by a resistance ($R_a$) of the motor.

14. The system of claim 11 wherein the motor comprises an ac motor (33) and the voltage measurement has a fundamental frequency, and wherein the computer further includes an extractor (44/46/48 or 58 or 60) for extracting fundamental signals corresponding to the fundamental frequency from the voltage measurement to produce an interfering voltage signal, and wherein the computer uses the interfering voltage signal in the motor model (50) to produce the equivalent current.

15. The system of claim 14 wherein the extractor comprises an analog filter (58 or 60).

16. The system of claim 14 further including an analog to digital converter for converting the voltage measurement to digital sampled voltage signals, and wherein extractor is adapted to Fourier transform the sampled voltage signals, identify fundamental signals from the transformed sampled voltage signals, and subtract the identified fundamental signals from the sampled voltage signals.

* * * * *